US011823631B2

(12) United States Patent
Bae et al.

(10) Patent No.: US 11,823,631 B2
(45) Date of Patent: *Nov. 21, 2023

(54) GATE DRIVER AND DISPLAY DEVICE HAVING THE SAME

(71) Applicant: SAMSUNG DISPLAY CO., LTD., Yongin-si (KR)

(72) Inventors: Jung-Bae Bae, Asan-si (KR); So-Young Lee, Asan-si (KR); Won-Se Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/059,407

(22) Filed: Nov. 28, 2022

(65) Prior Publication Data
US 2023/0087915 A1 Mar. 23, 2023

Related U.S. Application Data

(63) Continuation of application No. 17/370,959, filed on Jul. 8, 2021, now Pat. No. 11,514,861, which is a (Continued)

(30) Foreign Application Priority Data
Oct. 22, 2015 (KP) .................... 10-2015-0147270

(51) Int. Cl.
*G09G 5/00* (2006.01)
*G09G 3/3266* (2016.01)
(Continued)

(52) U.S. Cl.
CPC ......... *G09G 3/3266* (2013.01); *G09G 3/2085* (2013.01); *G11C 19/28* (2013.01);
(Continued)

(58) Field of Classification Search
CPC ............... G09G 3/3266; G09G 3/2085; G09G 2300/0413; G09G 2300/0426;
(Continued)

(56) References Cited

U.S. PATENT DOCUMENTS 8,638,413 B2    1/2014  Yang et al.
11,062,657 B2 *  7/2021  Bae ...................... G09G 3/3266
(Continued)

FOREIGN PATENT DOCUMENTS

KR    10-2007-0028629 A    3/2007
KR    10-2007-0082974 A    8/2007

OTHER PUBLICATIONS

Korean Notice of Allowance dated May 2, 2022, issued in Korean Patent Application No. 10-2015-0147270 (5 pages).

*Primary Examiner* — Adam J Snyder
(74) *Attorney, Agent, or Firm* — Lewis Roca Rothgerber Christie LLP

(57) ABSTRACT

A display device includes a display panel having a curved side or a polygonal side, the display panel including a plurality of pixels in a display region, a gate driver including a plurality of normal stages connected to each other for outputting gate signals to the pixels via a plurality of gate lines, and a plurality of dummy stages between some of the normal stages, and a data driver providing data signals to the pixels via a plurality of data lines.

8 Claims, 11 Drawing Sheets

Related U.S. Application Data continuation of application No. 16/503,077, filed on Jul. 3, 2019, now Pat. No. 11,062,657, which is a continuation of application No. 15/985,593, filed on May 21, 2018, now Pat. No. 10,347,189, which is a continuation of application No. 15/134,214, filed on Apr. 20, 2016, now Pat. No. 9,978,314.

(51) Int. Cl.
  *G09G 3/20* (2006.01)
  *G11C 19/28* (2006.01)
  *G09G 3/3275* (2016.01)

(52) U.S. Cl.
  CPC ........ *G11C 19/287* (2013.01); *G09G 3/3275* (2013.01); *G09G 2300/0413* (2013.01); *G09G 2300/0426* (2013.01); *G09G 2310/0262* (2013.01); *G09G 2310/0264* (2013.01); *G09G 2310/0286* (2013.01); *G09G 2310/08* (2013.01); *G09G 2320/02* (2013.01); *G09G 2320/0233* (2013.01); *G09G 2320/045* (2013.01); *G09G 2330/021* (2013.01); *G09G 2330/08* (2013.01); *G09G 2380/10* (2013.01)

(58) Field of Classification Search
  CPC ... G09G 2310/0262; G09G 2310/0286; G09G 2310/08; G09G 2320/02; G09G 2320/045; G09G 2330/08; G09G 2330/10; G09G 3/3275; G09G 2310/0264; G09G 2320/0233; G09G 2330/021; G11C 19/28; G11C 19/287
  See application file for complete search history.

(56) References Cited

U.S. PATENT DOCUMENTS

| | | |
|---|---|---|
| 11,514,861 B2 * | 11/2022 | Bae .................. G09G 3/3266 |
| 2005/0068287 A1 | 3/2005 | Lin et al. |
| 2006/0139255 A1 | 6/2006 | Kim et al. |
| 2008/0018557 A1 | 1/2008 | Maeda |
| 2008/0266210 A1 | 10/2008 | Nonaka |
| 2009/0021509 A1 | 1/2009 | Lee et al. |
| 2009/0102758 A1 | 4/2009 | Anzai et al. |
| 2009/0122951 A1 | 5/2009 | Tobita |
| 2009/0189835 A1 | 7/2009 | Kim et al. |
| 2010/0141570 A1 | 6/2010 | Horiuchi et al. |
| 2011/0102389 A1 | 5/2011 | Park et al. |
| 2011/0273408 A1 | 11/2011 | Ra et al. |
| 2012/0105398 A1 | 5/2012 | Park et al. |
| 2013/0201090 A1 * | 8/2013 | Ohara .................. G09G 3/3677 345/87 |
| 2014/0028534 A1 | 1/2014 | Park et al. |
| 2014/0103313 A1 | 4/2014 | Ma et al. |

\* cited by examiner

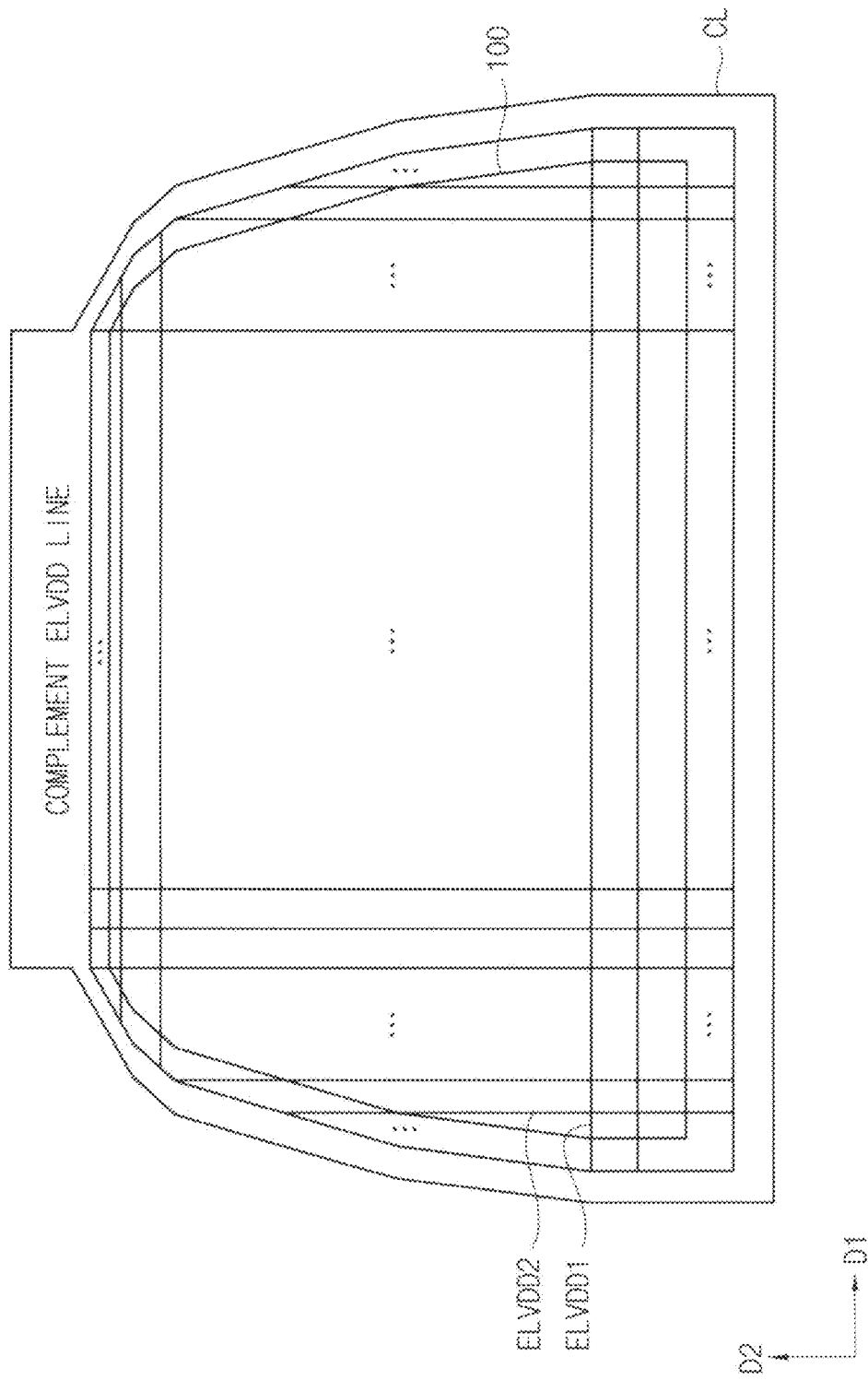

GATE DRIVER AND DISPLAY DEVICE HAVING THE SAME

CROSS-REFERENCE TO RELATED APPLICATIONS

This application is a continuation of U.S. patent application Ser. No. 17/370,959, filed Jul. 8, 2021, which is a continuation of U.S. patent application Ser. No. 16/503,077, filed Jul. 3, 2019, now U.S. Pat. No. 11,062,657, which is a continuation of U.S. patent application Ser. No. 15/985,593, filed May 21, 2018, now U.S. Pat. No. 10,347,189, which is a continuation of U.S. patent application Ser. No. 15/134,214, filed Apr. 20, 2016, now U.S. Pat. No. 9,978,314, which claims priority to and the benefit of Korean Patent Application No. 10-2015-0147270, filed Oct. 22, 2015, the entire content of all of which is incorporated herein by reference.

BACKGROUND

1. Technical Field

Example embodiments relate to a gate driver, and to a display device having the gate driver.

2. Description of the Related Art

A display device includes a display panel and a panel driver. Generally, the display panel has a rectangular shape. The display panel includes a plurality of pixels located in a display region to display an image. The panel driver is located in a non-display region. The panel driver includes a data driver for providing data signals to the pixels, and a gate driver for providing gate signals to the pixels.

Recently, display devices having one or more curved sides have been developed to meet design demands of smart devices for vehicles, smart watches, etc. However, when a display panel having curved sides is driven by a panel driver designed for a display panel having a rectangular shape, the display quality may decrease according to an arrangement of the panel driver.

SUMMARY

Some example embodiments provide a display device capable of improving display quality. Some example embodiments provide a gate driver for driving the display device.

According to some example embodiments, the display device may include a display panel having a curved side or a polygonal side, the display panel including a plurality of pixels located in a display region, a gate driver including: a plurality of normal stages connected to each other, and configured to output gate signals to the pixels via a plurality of gate lines; and a plurality of dummy stages between some of the normal stages, and a data driver configured to provide data signals to the pixels via a plurality of data lines.

In example embodiments, the pixels may be arranged in a first direction along which the gate lines extend and a second direction along which the data lines extend. A number of the dummy stages between two adjacent normal stages may decrease as an angle between the first direction and the curved side or the polygonal side of the display panel increases.

In example embodiments, each of the normal stages and the dummy stages may include an input terminal, a clock terminal, and an output terminal.

In example embodiments, the display device may include a power supply for providing a first gate voltage to the input terminal and the clock terminal of each of the dummy stages.

In example embodiments, the output terminal of each of the dummy stages may be in a floating state.

In example embodiments, the display device may include a power supply. Each of the normal stages and the dummy stages may further include a first power terminal configured to receive a first gate voltage and a second power terminal configured to receive a second gate voltage.

In example embodiments, a structure of each of the normal stages may be the same as a structure of each of the dummy stages.

In example embodiments, the normal stages and the dummy stages may be arranged in a curved line corresponding to a shape of the curved side or the polygonal side.

In example embodiments, the gate driver may provide scan signals and emission control signals to the pixels as the gate signals.

In example embodiments, the display device may further include a complement wiring portion including a complement power line surrounding the display region.

In example embodiments, the pixels may be arranged in a first direction and in a second direction. In example embodiments, the display panel may further include a first power line in the display region and extending in the first direction and a second power line in the display region and extending in the second direction. The complement power line may be connected to the first power line and the second power line.

In example embodiments, the complement power line may include a curved portion having a second width and a straight portion having a first width that may be greater than the second width.

According to some example embodiments, a gate driver may include a plurality of normal stages connected to each other and configured to respectively output gate signals to a plurality of gate lines, and a plurality of dummy stages between some of the normal stages.

In example embodiments, the normal stages and the dummy stages may be arranged in a curved line.

In example embodiments, a number of the dummy stages between two adjacent normal stages may decrease as an angle between a first direction along which the gate lines extend and the curved line increases.

In example embodiments, each of the normal stages and the dummy stages may include an input terminal, a clock terminal, and an output terminal.

In example embodiments, the display device may include a power supply for providing a first gate voltage to the input terminal and the clock terminal of each of the dummy stages.

In example embodiments, the output terminal of each of the dummy stages may be in a floating state.

In example embodiments, the display device may include a power supply. Each of the normal stages and the dummy stages may further include a first power terminal configured to receive a first gate voltage and a second power terminal configured to receive a second gate voltage.

In example embodiments, a structure of each of the normal stages may be the same as a structure of each of the dummy stages.

Therefore, the display device according to example embodiments may include a display panel having a curved side or having a polygonal side, and may include a gate driver for driving the display panel. The gate driver includes dummy stages located between normal stages, thereby increasing a uniformity of pattern density, and thereby preventing or reducing the occurrence of a stripe pattern generated by luminance difference. Further, the display device may include a complement wiring portion having a complement power line surrounding a display region, thereby reducing a voltage drop of a power voltage applied to the pixels, and thereby decreasing a variation of the power voltage. Therefore, the display device can have high display quality and meet various design demands.

A gate driver according to example embodiments can increase a uniformity of pattern density. Accordingly, the gate driver can stably drive the display panel having the curved side or the polygonal side.

BRIEF DESCRIPTION OF THE DRAWINGS

Illustrative, non-limiting example embodiments will be more clearly understood from the following detailed description taken in conjunction with the accompanying drawings.

The patent or application file contains at least one drawing executed in color. Copies of this patent or patent application publication with color drawing(s) will be provided by the Office upon request and payment of the necessary fee.

FIGS. 9A and 9B are diagrams for illustrating an effect of a complement wiring portion.

DETAILED DESCRIPTION OF THE EMBODIMENTS

Figure 1:
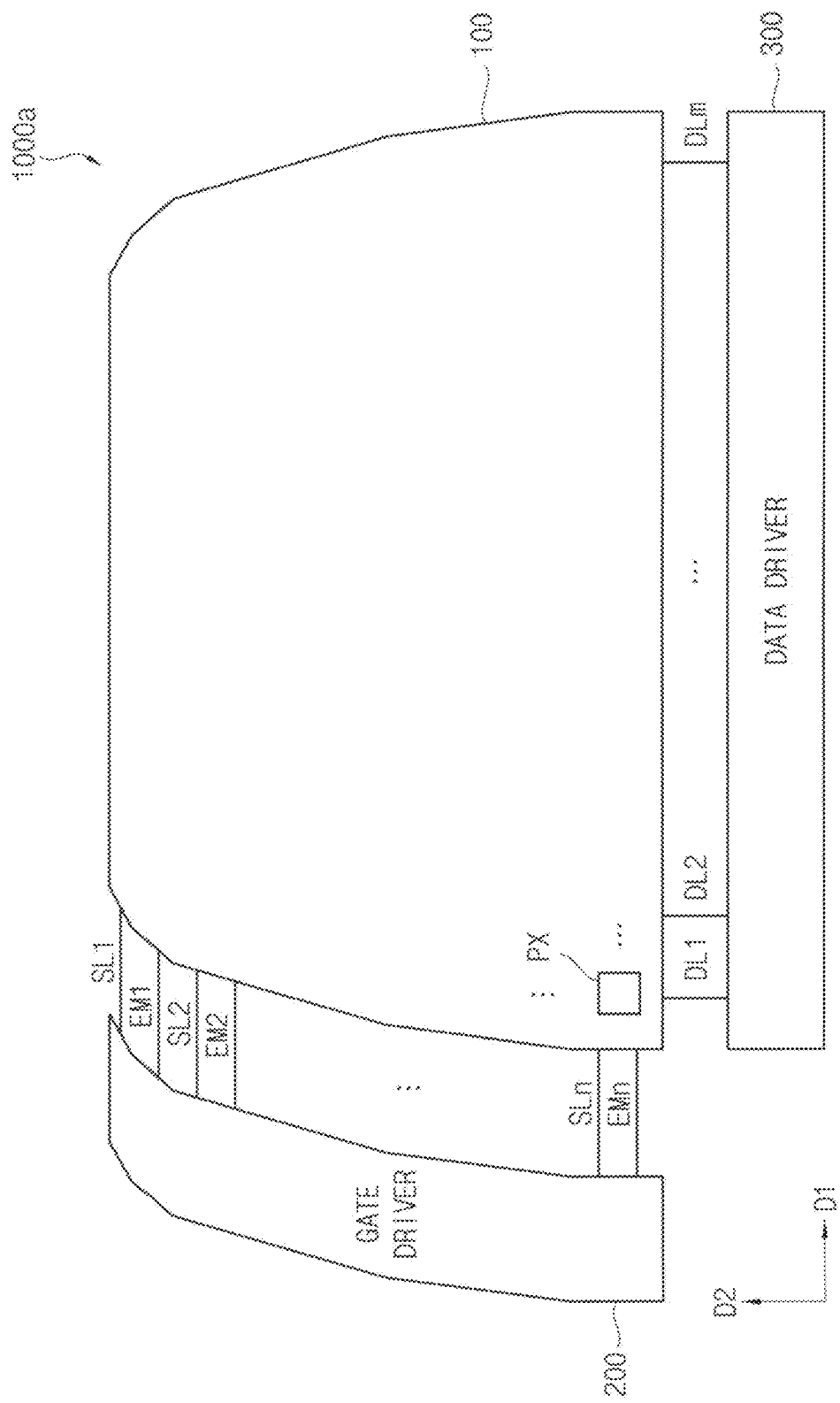
FIG. 1 is a block diagram illustrating a display device according to one example embodiment.

Exemplary embodiments will be described more fully hereinafter with reference to the accompanying drawings, in which various embodiments are shown.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the present invention.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Figure 2:
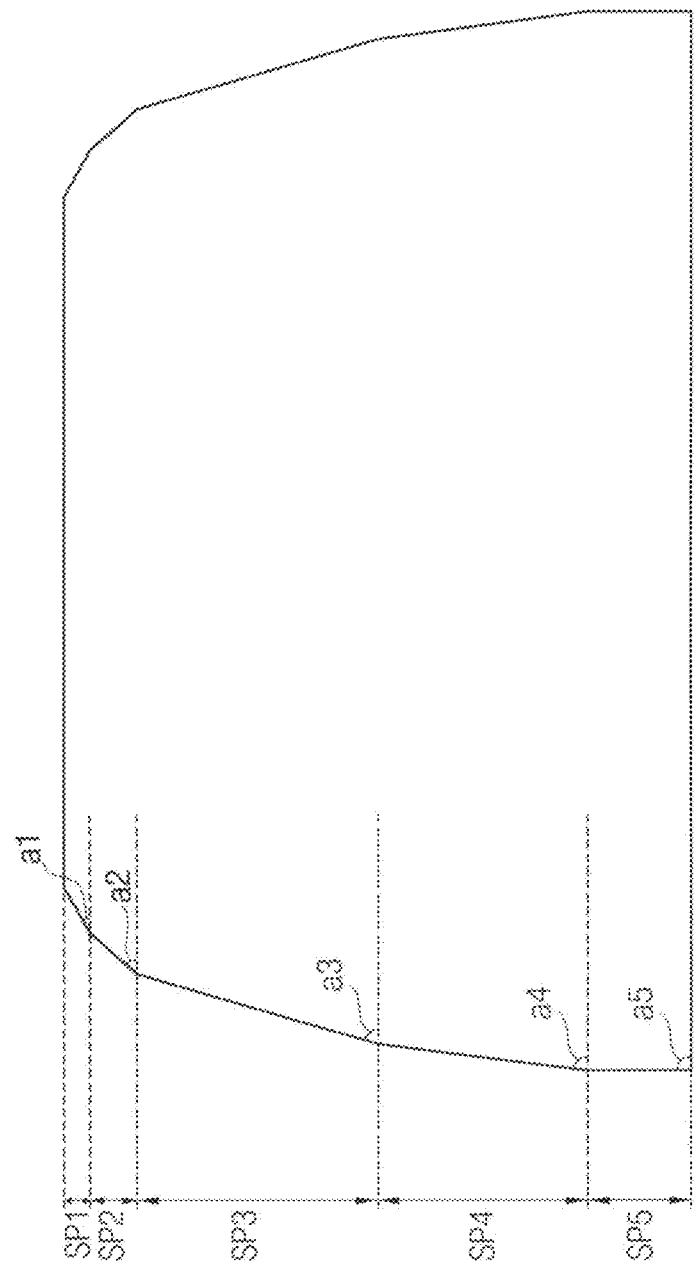
FIG. 2 is a block diagram illustrating an example of a display panel included in the display device of FIG. 1.

FIG. 1 is a block diagram illustrating a display device according to one example embodiment, and FIG. 2 is a block diagram illustrating an example of a display panel included in the display device of FIG. 1.

Referring to FIGS. 1 and 2, the display device 1000*a* may include a display panel 100, a gate driver 200, and a data driver 300.

The display panel 100 may have a curved side or a polygonal side. Thus, the display panel 100 may have circle shapes, semicircle shapes, oval shapes, polygon shapes, etc., as well as rectangular shapes to meet various designs. For example, the display panel 100 may have the curved side or the polygonal side to embed to a dashboard, a side mirror, a rearview mirror, etc., as part of a smart device for a vehicle.

In one example embodiment, as shown in FIGS. 1 and 2, the display panel 100 may include a first straight side and a second straight side that extend in a first direction D1. Also, the display panel 100 may include a first polygonal side connecting one terminal, or one end, of the first straight side to one terminal, or one end, of the second straight side, and may include a second polygonal side connecting another terminal, or another end, of the first straight side to another terminal, or another end, of the second straight side.

The first polygonal side may include a first side/section forming a first angle a1 with the first direction D1, a second side/section forming a second angle a2 with the first direction D1, a third side/section forming a third angle a3 with the first direction D1, a fourth side/section forming a fourth angle a4 with the first direction D1, and a fifth side/section forming a fifth angle a5 with the first direction D1. The second polygonal side may be symmetrical with the first polygonal side.

The pixels PX may be arranged in a first direction D1 and a second direction D2 (e.g., the pixels PX may be in a matrix). For example, the pixels PX may be arranged at locations corresponding to crossing regions of scan lines SL1 through SLn, which extend in the first direction D1, and data lines DL1 through DLm, which extend in the second direction D2, and may be located in a display region.

The gate driver 200 may provide gate signals to the pixels PX. In one example embodiment, the gate driver 200 may provide scan signals as the gate signals to the pixels PX via the scan lines SL1 through SLn. Further, the gate driver 200 may provide emission control signals as the gate signals to the pixels PX via emission control lines EM1 through EMn.

The gate driver 200 may include a plurality of normal stages that are connected (e.g., dependently connected) to each other for outputting the gate signals and a plurality of dummy stages located between the normal stages. In one example embodiment, the normal stages and the dummy stages may be arranged in a curved line, or in a plurality of lined segments forming a polygon, in a manner or shape corresponding to the curved side or the polygonal side. Accordingly, the gate driver 200 may have a shape corresponding to the curved side of the display panel 100, as shown in FIG. 1, or corresponding to a curved side of a display substrate.

The dummy stages may be located between the normal stages to increase a uniformity of pattern density. In one example embodiment, the quantity/number of the dummy stages between two adjacent normal stages may be determined based on an angle of the curved side or the polygonal side. For example, the quantity/number of the dummy stages between two adjacent normal stages may decrease as an angle (e.g., an acute angle) between the first direction and the curved side, or the polygonal side, of the display panel increases. Therefore, the gate driver 200 may output the scan signals and the emission control signals as the gate signals to the scan lines SL1 through SLn and to the emission control lines EM1 through EMn, respectively, at the correct timing.

A ratio of the quantity/number of the dummy stages to the quantity/number of the normal stages may decrease as the angle between the first direction D1 and the curved side or the polygonal side increases. For example, a first region SP1 of the display panel 100 may correspond to the first side forming the first angle a1 with the first direction D1. Because the first angle a1 is relatively small, four dummy stages may be located between two adjacent normal stages for providing the gate signals to the pixels PX of the first region SP1. Further, a second region SP2 of the display panel 100 may correspond to the second side forming the second angle a2 with the first direction D1. Because the second angle a2 is greater than the first angle a1, fewer dummy stages (e.g., three dummy stages) may be located between two adjacent normal stages for providing the gate signals to the pixels PX of the second region SP2. A third region SP3 of the display panel 100 may correspond to the third side forming the third angle a3 with the first direction D1. Because the third angle a3 is greater than the second angle a2, two dummy stages may be located between two adjacent normal stages for providing the gate signals to the pixels PX of the third region SP3. A fourth region SP4 of the display panel 100 may correspond to the fourth side forming the fourth angle a4 with the first direction D1. Because the fourth angle a4 is greater than the third angle a3, one dummy stage may be located between two adjacent normal stages for providing the gate signals to the pixels PX of the fourth region SP4. A fifth region SP5 of the display panel 100 may correspond to the fifth side forming the fifth angle a5 with the first direction D1. Because the fifth angle a5 is a right angle, the dummy stages may be omitted between two adjacent normal stages for providing the gate signals to the pixels PX located in the fifth region SP5.

Hereinafter, a structure of the gate driver 200 will be described in more detail with reference to FIGS. 3 through 5.

The data driver 300 may provide data signals to the pixels PX via the data lines DL1 through DLm.

Although the example embodiments of FIGS. 1 and 2 describe that the display panel 100 includes the first straight side, the second straight side, the first polygonal side, and the second polygonal side, the display panel 100 may have a variety of shapes.

Therefore, the display device 1000a may include the gate driver 200 having the dummy stages between the normal stages for driving the display panel 100 having the curved side or the polygonal side. Accordingly, the display device 1000a can prevent or reduce the occurrence of a stripe pattern generated by luminance difference.

Figure 3:
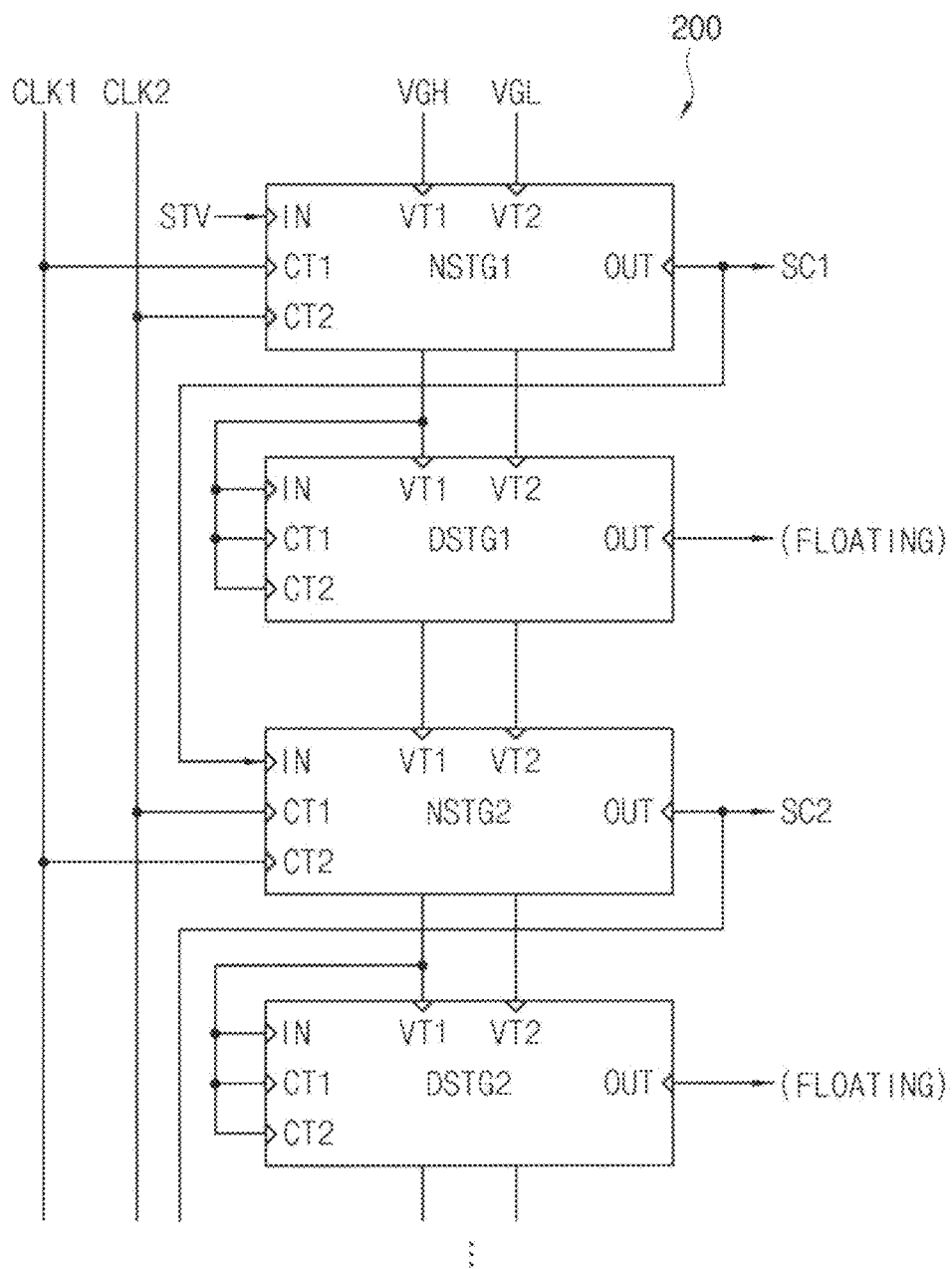
FIG. 3 is a block diagram illustrating an example of a gate driver included in the display device of FIG. 1.

FIG. 3 is a block diagram illustrating an example of the gate driver included in the display device of FIG. 1.

Referring to FIG. 3, the gate driver 200 may include a plurality of normal stages NSTG1, NSTG2, . . . and a plurality of dummy stages DSTG1, DSTG2, . . . . Each of the normal stages NSTG1, NSTG2, . . . and the dummy stages DSTG1, DSTG2, may include an input terminal IN, a first clock terminal CT1, a second clock terminal CT2, a first power terminal VT1, a second power terminal VT2, and an output terminal OUT.

A first clock signal CLK1 and a second clock signal CLK2 may have different timings, and may be respectively applied to the first clock terminal CT1 and the second clock terminal CT2 of the normal stages NSTG1, NSTG2, . . . . For example, the second clock signal CLK2 may be a signal inverted from the first clock signal CLK1. In adjacent stages, the first clock signal CLK1 and the second clock signal CLK2 may be applied in opposite sequences. For example, the first clock signal CLK1 may be applied to the first clock terminal CT1 of odd-numbered normal stages NSTG1, NSTG3, etc., and the second clock signal CLK2 may be applied to the second clock terminal CT2 of odd-numbered normal stages NSTG1, NSTG3, etc. Further, the second clock signal CLK2 may be applied to the first clock terminal CT1 of even-numbered normal stages NSTG2, NSTG4, etc., and the first clock signal CLK1 may be applied to the second clock terminal CT2 of even-numbered normal stages NSTG2, NSTG4, etc.

A vertical start signal SW, or an output signal of the previous normal stage, may be applied to the input terminal IN of the normal stages NSTG1, NSTG2, . . . . Thus, the vertical start signal SW may be applied to the input terminal IN of the first normal stage NSTG1. The output signals of a previous normal stage (e.g., NSTG1) may be respectively applied to each input terminal IN of a subsequent normal stage (e.g., NSTG2).

The output terminal OUT may output the output signal to the gate line (e.g., a scan line or an emission control line) connected to the output terminal OUT. For example, the output signals (e.g., SC1) from the output terminal OUT of the odd-numbered normal stages NSTG1, etc., may be outputted in sync with a low signal of the second clock signal CLK2. Also, the output signals (e.g., SC2) from the output terminal OUT of the even-numbered normal stages NSTG2, etc., may be outputted in sync with a low signal of the first clock signal CLK1.

A first gate voltage VGH may be applied to the first power terminal VT1 of the normal stages NSTG1, NSTG2, etc. For example, the first gate voltage VGH may be high level voltage. A second gate voltage VGL may be applied to the second power terminal VT2 of the normal stages NSTG1, NSTG2, etc. For example, the second gate voltage VGL may be low level voltage.

On the other hand, because the dummy stages DSTG1, DSTG2, . . . are for increasing a uniformity of pattern density, the dummy stages DSTG1, DSTG2, . . . might not output the gate signal. Accordingly, the output terminals OUT of the dummy stages DSTG1, DSTG2, . . . may be in a floating state. Also, to increase the durability of the gate driver 200 with regard to static electricity, the first gate voltage VGH may be applied to the input terminal IN, the first clock terminal CT1, and the second clock terminal CT2 of the dummy stages DSTG1, DSTG2, . . . . Also, the first gate voltage VGH may be applied to the first power terminal VT1 of the dummy stages DSTG1, DSTG2, . . . . The second gate voltage VGL may be applied to the second power terminal VT2 of the dummy stages DSTG1, DSTG2, . . . .

Although the example embodiments of FIG. 3 describe that each of the normal stages NSTG1, NSTG2, etc., outputs only one gate signal, the present invention is not limited thereto, and, in other embodiments, each of the normal stages NSTG1, NSTG2, etc., may output a plurality of gate signals. For example, each of the normal stages NSTG1, NSTG2, etc., may provide a scan signal and an emission control signal as the gate signal (e.g., SC1, SC2, etc.) to the pixels.

Figure 4:
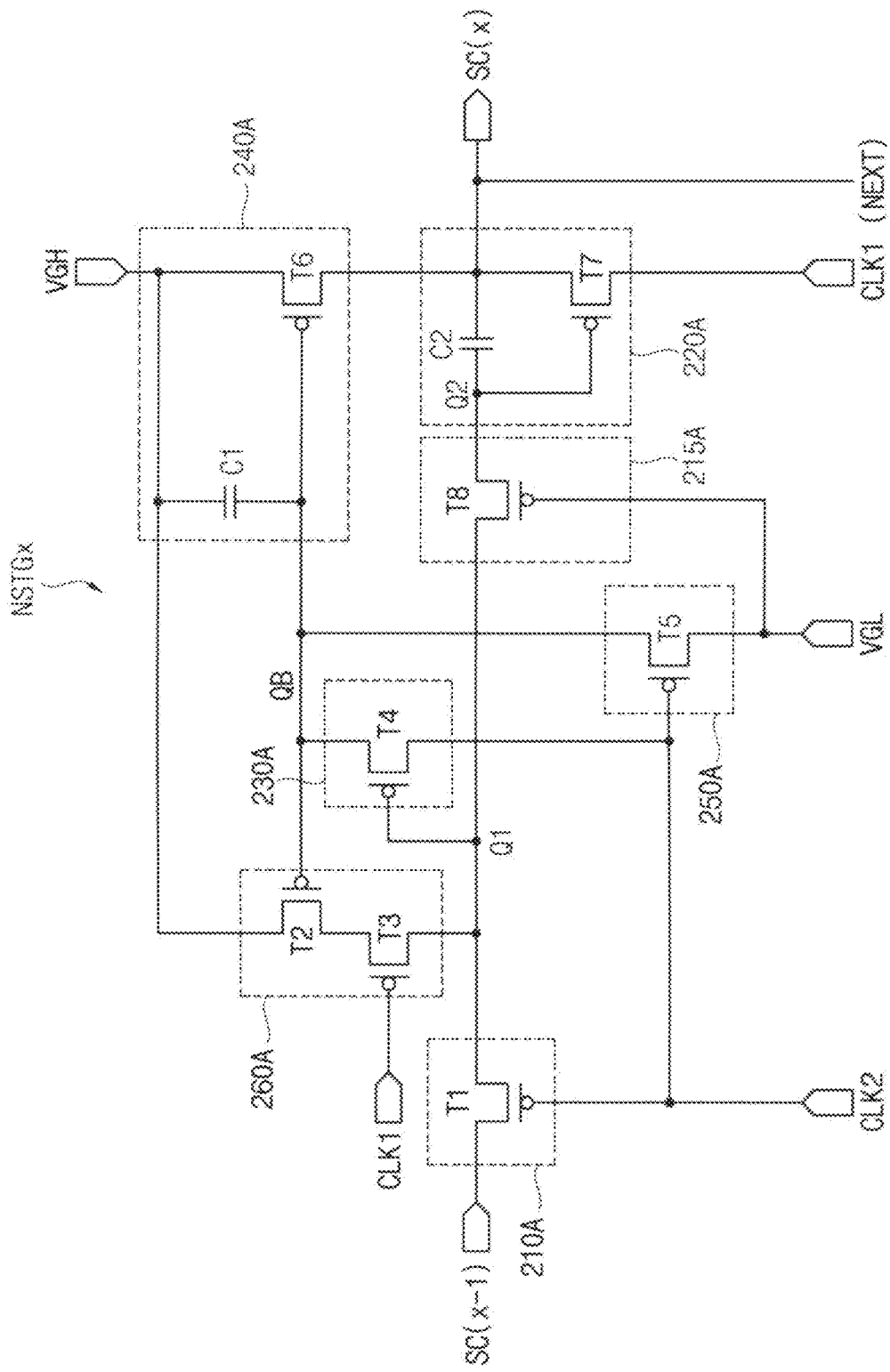
FIG. 4 is a circuit diagram illustrating an example of a normal stage included in the gate driver of FIG. 3.

FIG. 4 is a circuit diagram illustrating an example of a normal stage included in the gate driver of FIG. 3.

Referring to FIG. 4, an (x)th normal stage NSTGx may include a first input part 210A, a node control part 215A, a first output part 220A, a second input part 230A, a second output part 240A, a holding part 250A, and a stabilizing part 260A, where x is a natural number greater than 1.

An input terminal of the (x)th normal stage NSTGx may receive an (x−1)th output signal SC(x−1) outputted from the previous normal stage as an input signal. A first clock terminal and a second clock terminal of the (x)th normal stage NSTGx may receive a first clock signal CLK1 or a second clock signal CLK2. A first power terminal of the (x)th normal stage NSTGx may receive a first gate voltage VGH. A second power terminal of the (x)th normal stage NSTGx may receive a second gate voltage VGL. An output terminal of the (x)th normal stage NSTGx may output an (x)th output signal SC(x).

The first input part 210A may apply the input signal SC(x−1) to a first node Q1 in response to the second clock signal CLK2. The first input part 210A may include a first input transistor T1. The first input transistor T1 may include a gate electrode connected to the second clock terminal, a first electrode connected to the input terminal, and a second electrode connected to the first node Q1.

The node control part 215A may be located between the first node Q1 and the second node Q2. The node control part 215A may reduce stress of nodes, and may stably maintain the voltage of nodes. The node control part 215A may include a node control transistor T8. The node control transistor T8 may include a gate electrode connected to the second power terminal, a first electrode connected to the first node Q1, and a second electrode connected to the second node Q2. The node control transistor T8 may maintain a turn-on status because the gate electrode of the node control transistor T8 is connected to the second power terminal to which the second gate voltage VGL is applied.

The first output part 220A may output the first clock signal CLK1 as the (x)th output signal SC(x) in response to a node signal applied to the second node Q2. The first output part 220A may adjust the (x)th output signal SC(x) to a first logic level (e.g., low level) in response to the node signal applied to the second node Q2. The first output part 220A may include a first output transistor T7 and a second capacitor C2. The first output transistor T7 may include a gate electrode connected to the second node Q2, a first electrode connected to the first clock terminal, and a second electrode connected to the output terminal. The second capacitor C2 may include a first electrode connected to the second node Q2, and a second electrode connected to the output terminal.

The second input part 230A may apply the second clock signal CLK2 to a third node QB in response to a node signal of the first node Q1. The second input part 230A may include a second input transistor T4. The second input transistor T4 may include a gate electrode connected to the first node Q1, a first electrode connected to the second clock terminal, and a second electrode connected to the third node QB.

The second output part 240A may output a first gate voltage VGH as the (x)th output signal SC(x) in response to a node signal applied to the third node QB. The second output part 240A may adjust the (x)th output signal to a second logic level (e.g., high level) in response to a node signal applied to the third node QB. The second output part 240A may include a second output transistor T6 and a first capacitor C1. The second output transistor T6 may include a gate electrode connected to the third node QB, a first electrode connected to the first power terminal, and a second electrode connected to the output terminal. The first capacitor C1 may include a first electrode connected to the third node QB and a second electrode connected to the first power terminal.

The holding part 250A may maintain the node signal of the third node QB in response to the second clock signal CLK2. The holding part 250A may include a holding transistor T5. The holding transistor T5 may include a gate electrode connected to the second clock terminal, a first electrode connected to the second power terminal, and a second electrode connected to the third node QB. For example, when the second clock signal CLK2 has the second logic level, the holding transistor T5 of the holding part 250A may be turned off. When the second clock signal CLK2 has the first logic level, the holding transistor T5 of the holding part 250A may be turned on, thereby maintaining voltage of the third node QB to the second gate voltage VGL.

The stabilizing part 260A may stabilize the (x)th output signal SC(x) in response to the node signal of the third node QB and the first clock signal CLK1. The stabilizing part 260A may include a first stabilizing transistor T2 and a second stabilizing transistor T3 that are connected to each other in series. The first stabilizing transistor T2 may include a gate electrode connected to the third node QB, a first electrode connected to the first power terminal, and a second electrode connected to a first electrode of the second stabilizing transistor T3. The second stabilizing transistor T3 may include a gate electrode connected to the first clock terminal, the first electrode connected to the second electrode of the first stabilizing transistor T2, and a second electrode connected to the first node Q1.

Figure 5:
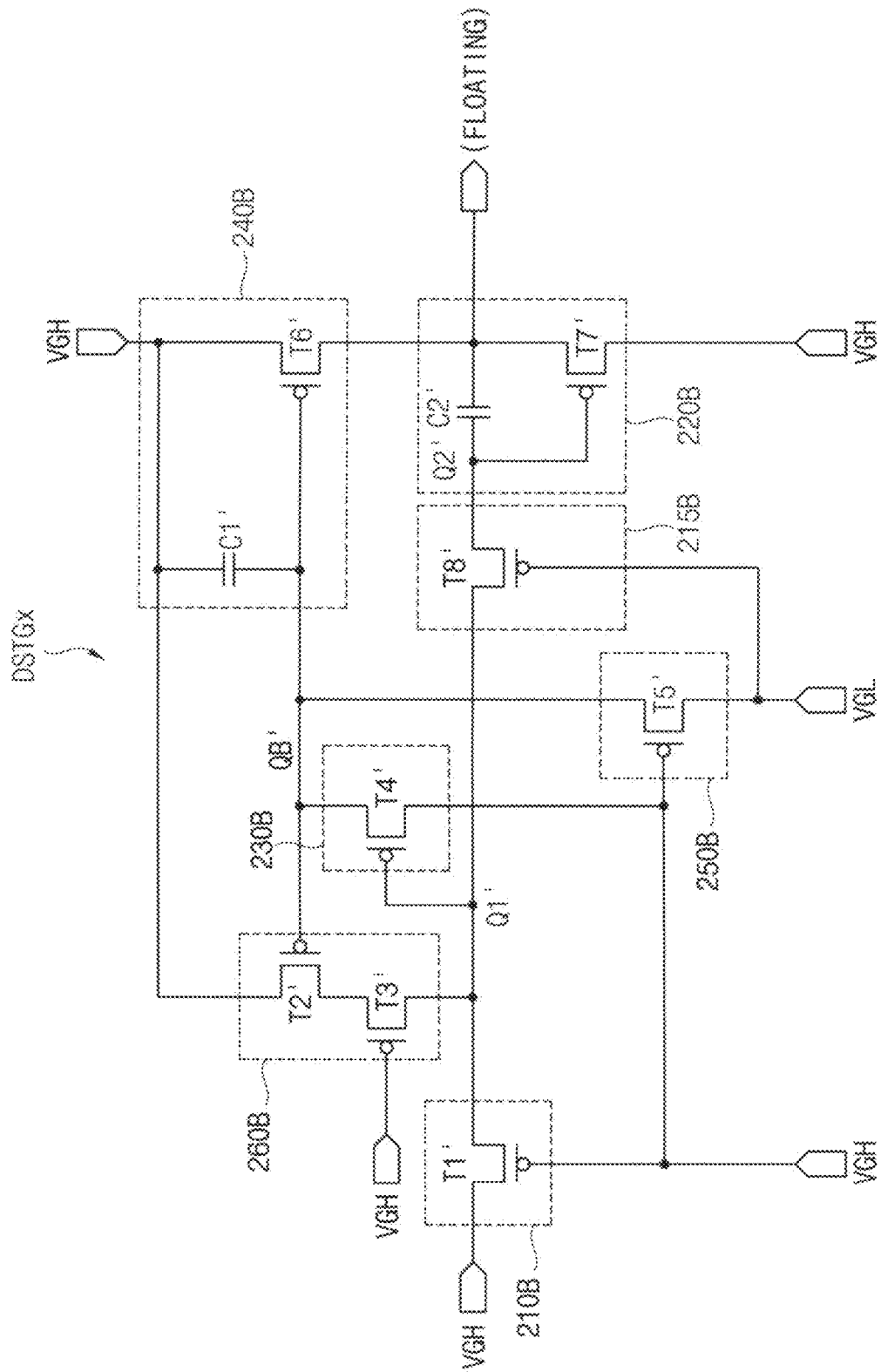
FIG. 5 is a circuit diagram illustrating an example of a dummy stage included in the gate driver of FIG. 3.

FIG. 5 is a circuit diagram illustrating an example of a dummy stage included in the gate driver of FIG. 3.

Referring to FIG. 5, a structure of each of the dummy stages may be substantially the same as a structure of each of the normal stages. For example, an (x)th dummy stage DSTGx may include a first input part 210B, a node control part 215B, a first output part 220B, a second input part 230B, a second output part 240B, a holding part 250B, and a stabilizing part 260B.

An input terminal, a first clock terminal, and a second clock terminal of the (x)th dummy stage DSTGx may receive a first gate voltage VGH. A first power terminal of the (x)th dummy stage DSTGx may also receive first gate voltage VGH. A second power terminal of the (x)th dummy stage DSTGx may receive a second gate voltage VGL. An output terminal of the (x)th dummy stage DSTGx may be in a floating state.

The first input part 210B may include a first input transistor T1'. The first input transistor T1' may include a gate electrode connected to the second clock terminal, a first electrode connected to the input terminal, and a second electrode connected to the first node Q1'.

The node control part 215B may include a node control transistor T8'. The node control transistor T8' may include a gate electrode connected to the second power terminal, a first electrode connected to the first node Q1', and a second electrode connected to the second node Q2'.

The first output part 220B may include a first output transistor T7' and a second capacitor C2'. The first output transistor T7' may include a gate electrode connected to the second node Q2', a first electrode connected to the first clock terminal, and a second electrode connected to the output terminal. The second capacitor C2' may include a first electrode connected to the second node Q2' and a second electrode connected to the output terminal.

The second input part 230B may include a second input transistor T4'. The second input transistor T4' may include a gate electrode connected to the first node Q1', a first electrode connected to the second clock terminal, and a second electrode connected to a third node QB'.

The second output part 240B may include a second output transistor T6' and a first capacitor C1'. The second output transistor T6' may include a gate electrode connected to the third node QB', a first electrode connected to the first power terminal, and a second electrode connected to the output terminal. The first capacitor C1' may include a first electrode connected to the third node QB' and a second electrode connected to the first power terminal.

The holding part 250B may include a holding transistor T5'. The holding transistor T5' may include a gate electrode connected to the second clock terminal, a first electrode connected to the second power terminal, and a second electrode connected to the third node QB'.

The stabilizing part 260B may include a first stabilizing transistor T2' and a second stabilizing transistor T3' that are connected to each other in series. The first stabilizing transistor T2' may include a gate electrode connected to the third node QB', a first electrode connected to the first power terminal, and a second electrode connected to a first electrode of the second stabilizing transistor T3'. The second stabilizing transistor T3' may include a gate electrode connected to the first clock terminal, the first electrode connected to the second electrode of the first stabilizing transistor T2', and a second electrode connected to the first node Q1'.

Although the example embodiments of FIG. 4 and FIG. 5 describe that each of the normal stages and the dummy stages includes the first input part, the node control part, the first output part, the second input part, the second output part, the holding part, and the stabilizing part, the normal stages and/or the dummy stages may be implemented as a variety of structures.

Although the example embodiments of FIG. 4 and FIG. 5 describe that the structure of each of the normal stages is substantially the same as the structure of each of the dummy stages, the structure of each of the normal stages may be different from the structure of each of the dummy stages in other embodiments. For example, the normal stages may further include a direction determining part for determining an output direction (e.g., the first output direction progressively outputting from the first normal stage to the (N)th normal stage, or the second output direction progressively outputting from the (N)th normal stage to the first normal stage) of the gate signals in comparison with the dummy stages.

Figure 6:
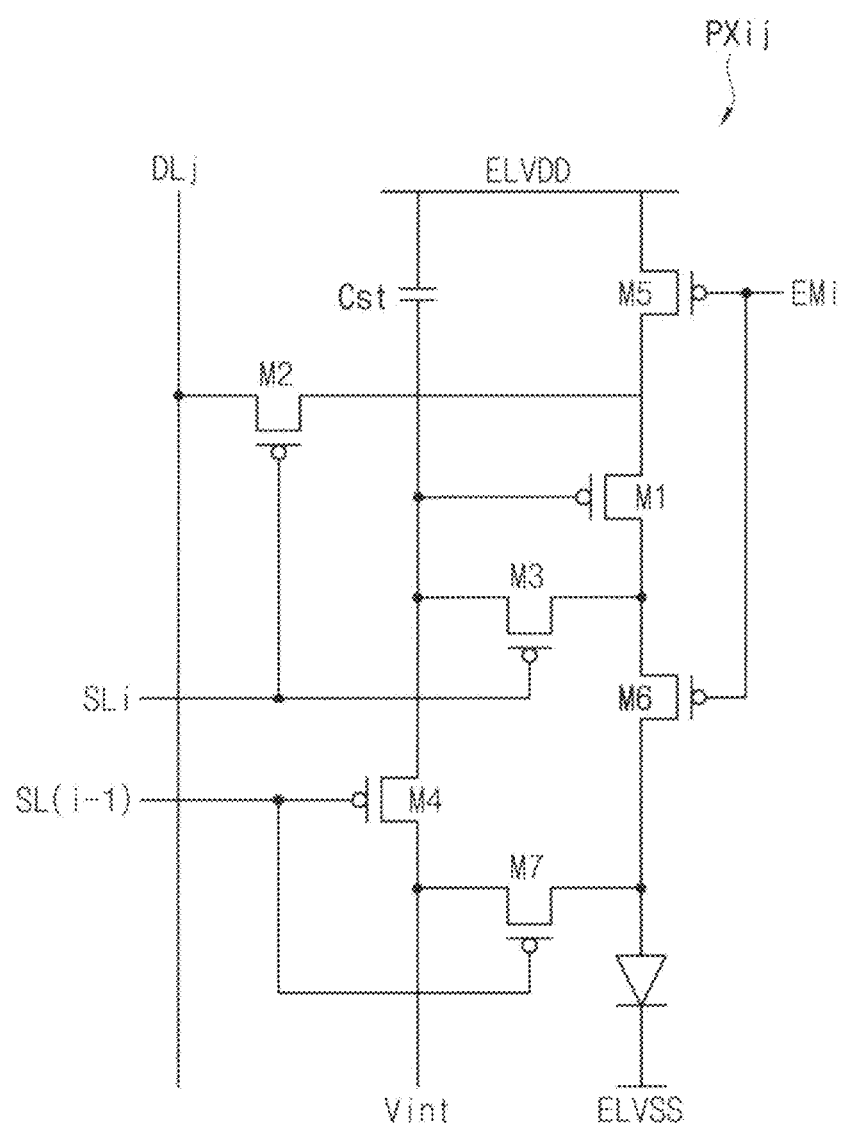
FIG. 6 is a circuit diagram illustrating an example of a pixel included in the display panel of FIG. 2.

FIG. 6 is a circuit diagram illustrating an example of a pixel included in the display panel of FIG. 2.

Referring to FIG. 6, the pixel(s) PXij may include a plurality of transistors M1 through M7 and a driving capacitor Cst. For example, the first transistor M1 may be connected between a high power voltage ELVDD and an anode electrode of an organic light emitting diode (OLED), and may provide a driving current corresponding to the data signal to the OLED. The second transistor M2 may be connected between a first electrode of the first transistor M1 and a data line DLj. The third transistor M3 may be connected between a gate electrode and a second electrode of the first transistor M1. The fourth transistor M4 may be connected between an initialization voltage Vint and the gate electrode of the first transistor M1. The fifth transistor M5 may be connected between the high power voltage ELVDD and the first electrode of the first transistor M1. The sixth transistor M6 may be connected between the second electrode of the first transistor M1 and the anode electrode of the OLED. The seventh transistor M7 may be connected between the initialization voltage Vint and the anode electrode of the OLED.

Specifically, the fourth transistor M4 may apply the initialization voltage Vint to the driving capacitor Cst and to the gate electrode of the first transistor M1 in response to an (i−1)th scan signal received from an (i−1)th scan line SL(i−1) to reset the driving capacitor Cst and the gate electrode of the first transistor M1. The seventh transistor M7 may apply the initialization voltage Vint to the anode electrode of the OLED in response to the (i−1)th scan signal to reset the anode electrode of the OLED.

The second transistor M2 may apply a data signal to the first transistor M1 in response to an (i)th scan signal received from an ith scan line SLi.

The third transistor M3 may compensate a threshold voltage of the first transistor M1 in response to the (i)th scan signal by connecting the gate electrode and the drain/second electrode of the first transistor M1 (i.e., by causing a diode connection of the first transistor M1). Because the second transistor M2 and the third transistor M3 may receive the (i)th scan signal, the data signal can be applied while the threshold voltage of the first transistor M1 is compensated.

The first transistor M1 may provide the driving current corresponding to the data signal to the OLED.

The sixth transistor M6 may be located between the second electrode of the first transistor M1 and the anode electrode of the OLED. The sixth transistor M6 may control light emission of the OLED in response to an (i)th emission control signal.

Although the example embodiments of FIG. 6 describe that the (i−1)th scan signal is applied to the gate electrodes of the fourth transistor and the seventh transistor, in other embarrass, a first gate signal may be applied to the gate electrode of the fourth transistor, and a second gate signal may be applied to the gate electrode of the seventh transistor. In this case, the gate driver includes a plurality of stage sets, each stage set outputting the first gate signal, the second gate signal, and the emission control signal as the gate signals.

Although the example embodiment of FIG. 6 describes that the pixel PXij includes the first through seventh transistors M1 to M7 and the driving capacitor Cst, the pixel may be implemented as a variety of structures.

Figure 7A:
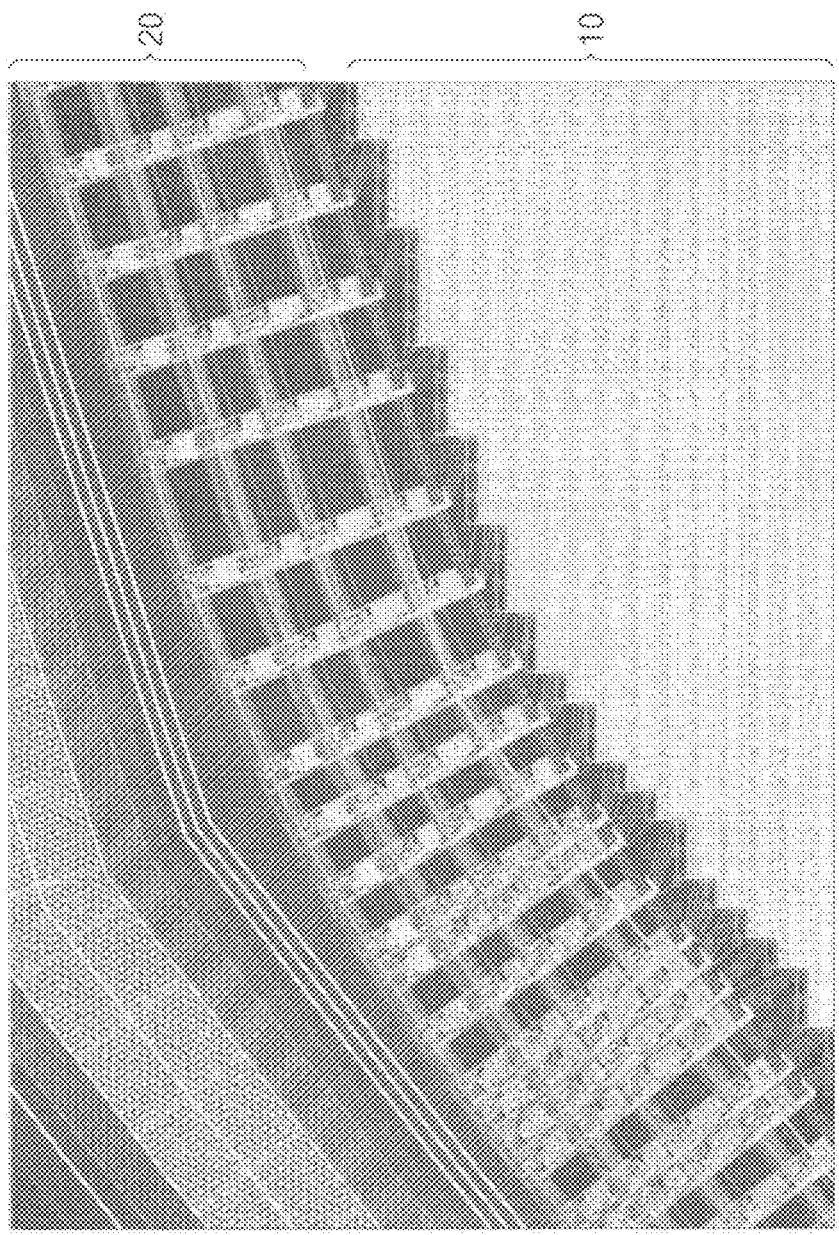
FIGS. 7A and 7B are color diagrams for illustrating an effect of dummy stages included in the gate driver of FIG. 3.
Figure 7B:
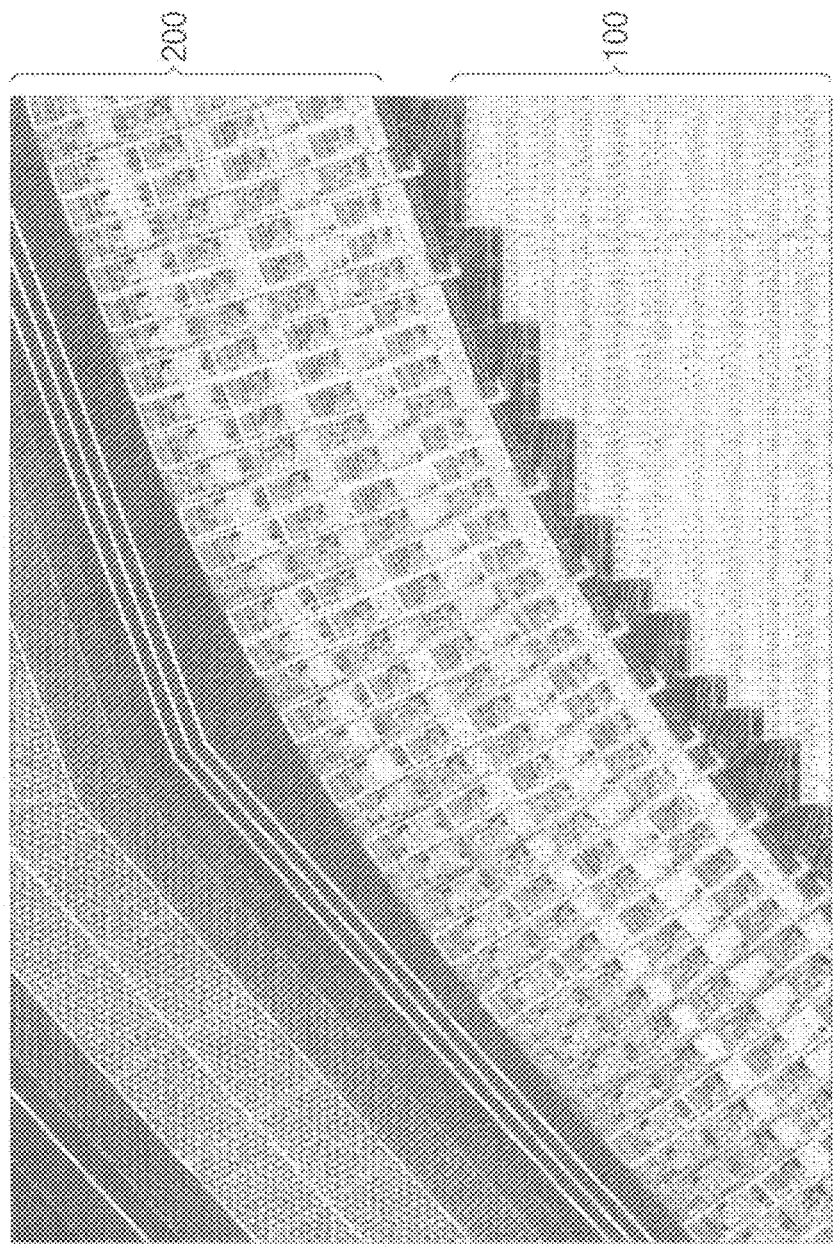

FIGS. 7A and 7B are diagrams for illustrating an effect of dummy stages included in the gate driver of FIG. 3.

Referring to FIGS. 7A and 7B, the gate driver may include dummy stages located between normal stages, thereby increasing a uniformity of pattern density.

As shown in FIG. 7A, a comparative gate driver 20 only includes normal stages for outputting the gate signals for driving a comparative display panel 10 having the curved side or the polygonal side. In this case, it is difficult to arrange the normal stages of the comparative gate driver 20 such that the pattern density is uniform. Accordingly, a timing of a rising edge or a falling edge of the gate signals outputted from the comparative gate driver 20 may be advanced or delayed because of a density deviation.

On the other hand, as shown in FIG. 7B, the gate driver 200 includes dummy stages and normal stages for driving the display panel 100 having the curved side or the polygonal side. In this case, the dummy stages may be located between the normal stages (e.g., at varying quantities or numbers) such that the pattern density is uniform. Accordingly, the gate driver 200 can output the gate signals at the correct timing.

Figure 8:
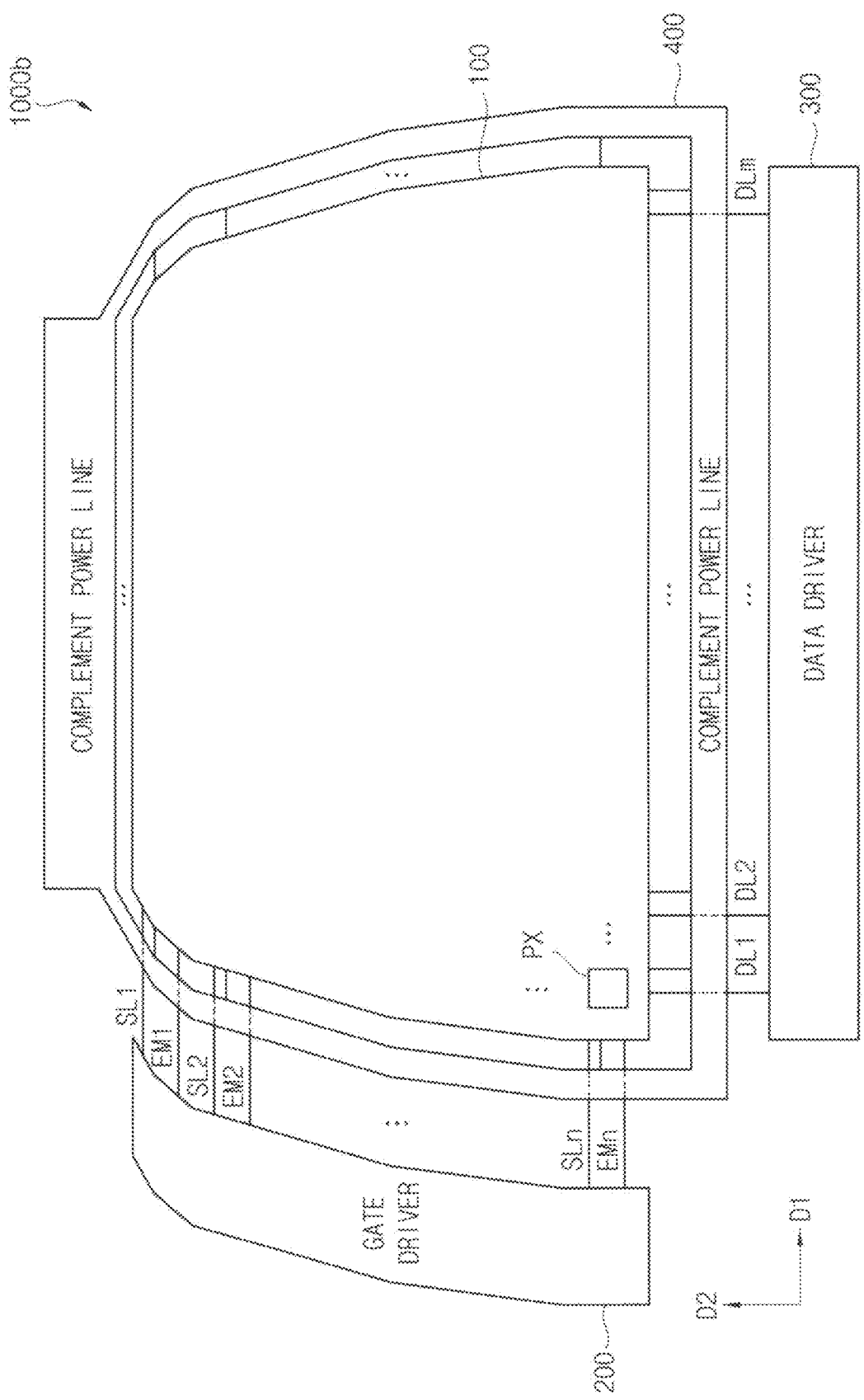
FIG. 8 is a block diagram illustrating a display device according to another example embodiment.

FIG. 8 is a block diagram illustrating a display device according to another example embodiment.

Referring to FIG. 8, the display device 1000b may include a display panel 100, a gate driver 200, and a data driver 300, and a complement wiring portion/complement power line 400. The display device 1000b according to the present exemplary embodiment is substantially the same as the display device 1000a of the exemplary embodiment described in FIG. 1, except that the complement wiring portion 400 is added. Therefore, the same reference numerals will be used to refer to the same or like parts as those described in the previous exemplary embodiment of FIG. 1, and any repetitive explanation concerning the above elements (or components) may be omitted.

The display panel 100 may have a curved side or a polygonal side. The pixels PX may be arranged in a first direction D1 and a second direction D2. For example, the pixels PX may be arranged at locations corresponding to crossing regions of the scan lines SL1 through SLn, which extend in the first direction D1, and the data lines DL1 through DLm, which extend in the second direction D2, and may be located in a display region.

The gate driver 200 may provide gate signals to the pixel PX. The gate driver 200 may include a plurality of normal stages connected (e.g., dependently connected) to each other for outputting the gate signals, and may include a plurality of dummy stages located between the normal stages. The dummy stages may be located between the normal stages to thereby increase a uniformity of pattern density. In one example embodiment, the quantity/number of the dummy stages located between two adjacent normal stages may be determined based on an angle of the curved side or the polygonal side.

The data driver 300 may provide the data signals to the pixels PX via the data lines DL1 through DLm.

The complement wiring portion 400 may include a complement power line surrounding the display region in which the pixels PX are located. In one example embodiment, the pixel PX may receive a high power voltage via the complement power line. The complement power line may surround the display region and may be connected to the power lines extending in the first direction D1 or the second direction D2. Accordingly, a voltage drop of the high power voltage may be reduced, and a variation of the power voltage applied to the pixels PX may decrease. Therefore, the display device 1000b can prevent or reduce a characteristic degradation, which may occur in the outer portion of the display panel 100 having the curved side or the polygonal side by including the complement wiring portion 400. Specifically, when the display panel 100 is a curved display panel, colors on the curved region or edge region appearing darker (i.e., white angular dependency (WAD)) may be improved.

Figure 9A:
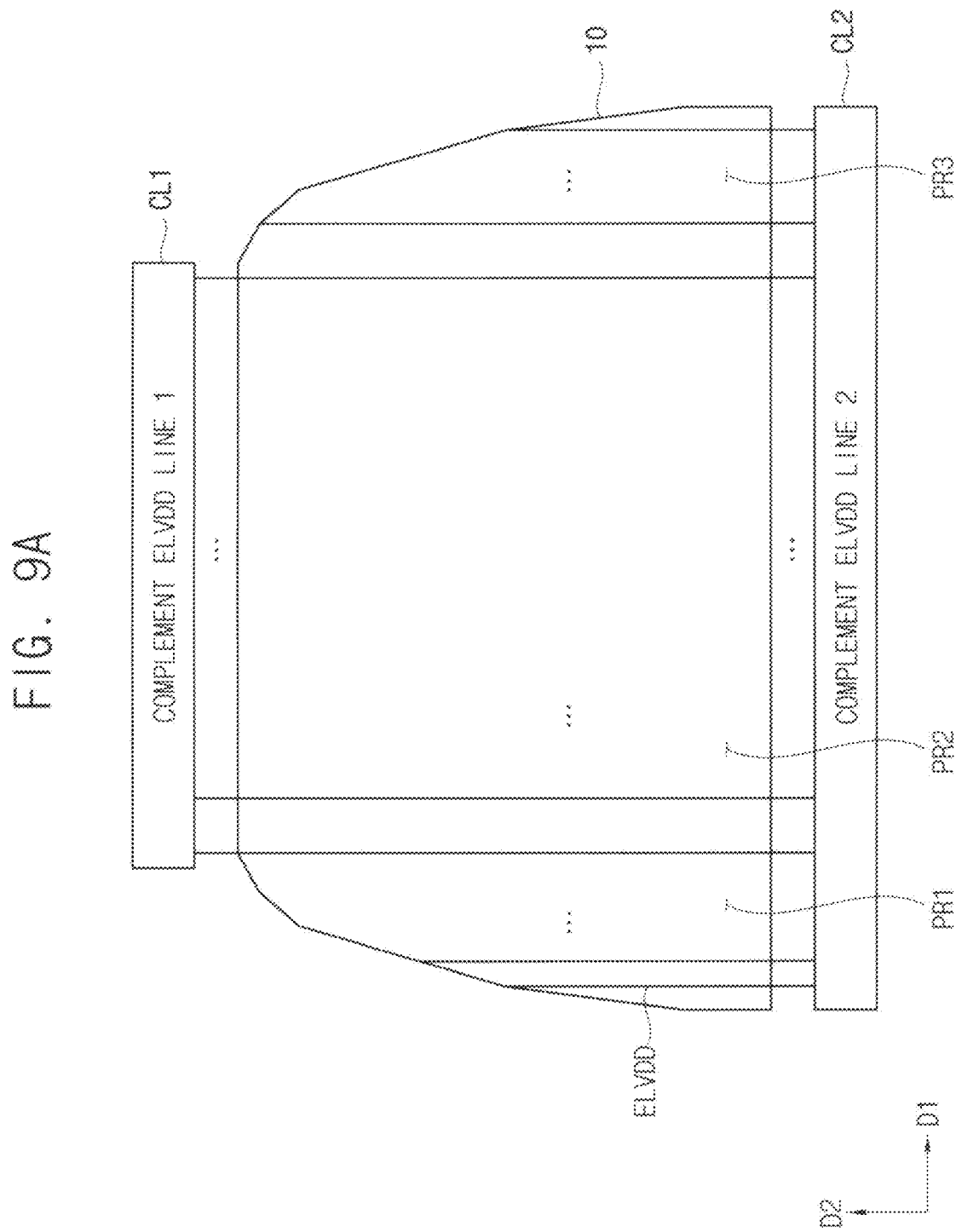

FIGS. 9A and 9B are diagrams for illustrating an effect of a complement wiring portion.

Referring to FIGS. 9A and 9B, a complement power line may surround a display region having a curved side or a polygonal side, thereby providing a uniform voltage to pixels.

As shown in FIG. 9A, a comparative display panel 10 may include a first straight side and a second straight side that extend in a first direction D1. Also, the comparative display panel 10 may include a first polygonal side connecting one terminal/end of the first straight side to one terminal/end of the second straight side, and may include a second polygonal side connecting another terminal of the first straight side to another terminal of the second straight side. A first complement power line CL1 and a second complement power line CL2 extending in a first direction D1 may be located outside of the comparative display panel 10. The pixel may receive the high power voltage via a power line ELVDD that is connected to the first complement power line CL1 and the second complement power line CL2, and that extends in the second direction D2. In a second region PR2 located between the first complement power line CL1 and the second complement power line CL2, a magnitude of the voltage drop and a variation of the high power voltage are relatively small because the pixels of the second region PR2 receive the high power voltage via the first and second complement power lines located at both sides. However, in first and third regions PR1 and PR3, the magnitude of the voltage drop is relatively large because the pixels of the first and third regions PR1 and PR3 receive the high power voltage via the second complement power line only. Therefore, display quality may decrease in a region near the first polygonal side and the second polygonal side.

As shown in FIG. 9B, the display panel 100 may include a first straight side, a second straight side, a first polygonal side, and a second polygonal side. The complement power line CL may surround the display region. The pixel may be connected to the complement power line CL. The pixel may receive the high power voltage via a first power line ELVDD1 extending in the first direction D1, and via a second power line ELVDD2 extending in the first direction D2. Accordingly, the voltage drop of the high power voltage can be reduced, and the pixel can receive the uniform voltage.

The complement power line CL may be located in the non-display region in which the panel drivers (e.g., a data driver, a gate driver, etc.) are located. The complement power line CL may have various suitable widths according to the location. In one example embodiment, the complement power line CL may include a curved portion next to the first polygonal side and to the second polygonal side of the display panel 100, and may include a straight portion next to the first straight side and to the second straight side. A first width of the straight portion may be greater than a second width of the curved portion. For example, the first width of the straight portion may be about 100 micrometers, the second width of the curved portion may be about 20 micrometers, and a width of the first and second power lines ELVDD1 and ELVDD2 may be about 4 micrometers.

Although the example embodiments of the present invention describe that the display device is an organic light emitting display device, the display device type is not limited thereto.

The present inventive concept may be applied to an electronic device having a display device. For example, the present inventive concept may be applied to smart devices for vehicles, smart watches, cellular phones, smart phones, smart pads, electronic billboards, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims and their equivalents. Therefore, it is to be understood that the foregoing is illustrative of various embodiments and is not to be construed as being limited to the specific embodiments disclosed, and that modifications to the disclosed embodiments, as well as other embodiments, are intended to be included within the scope of the appended claims and their equivalents.

What is claimed is:

1. A display device comprising:
    a plurality of pixels in a display region to display an image;
    a plurality of gate lines;
    a plurality of data lines crossing the gate fines; and
    a gate driver in a non-display region adjacent to the display region, wherein at least a portion of the non-display region has a curved shape in a plan view,
    wherein the gate driver comprises:
    a plurality of normal gate drivers each having an output terminal that is electrically connected to a corresponding one of the gate lines; and
    a plurality of dummy gate drivers each having an output terminal that is electrically floated,
    wherein the gate driver has a structure in which at least one of the plurality of dummy gate drivers is located between some of the plurality of normal gate drivers to increase a uniformity of pattern density of the gate driver.

2. The display device of claim 1, wherein a gate signal for driving the pixels is output from the output terminal of each of the normal gate drivers, and the gate signal is not output from the output terminal of any of the dummy gate drivers.

3. The display device of claim 1, wherein the output terminal of each of the dummy gate drivers is not electrically connected to any of the pixels nor another one of the normal gate drivers.

4. The display device of claim 1, wherein each of the dummy gate drivers comprises an input terminal and at least one clock terminal, and a same signal is input to the input terminal and the dock terminal.

5. The display device of claim 4, wherein each of the dummy gate drivers comprises a first power terminal to which a first gate voltage is input and a second power terminal to which a second gate voltage lower than the first gate voltage is input.

6. The display device of claim 5, wherein the same signal is a constant voltage.

7. The display device of claim 6, wherein the constant voltage is the first gate voltage.

8. The display device of claim 1, further comprising:
    a data driver in the non-display region, the data driver being electrically connected to the data lines.

* * * * *

UNITED STATES PATENT AND TRADEMARK OFFICE
CERTIFICATE OF CORRECTION

| | |
|---|---|
| PATENT NO. | : 11,823,631 B2 |
| APPLICATION NO. | : 18/059407 |
| DATED | : November 21, 2023 |
| INVENTOR(S) | : Jung-Bae Bae et al. |

It is certified that error appears in the above-identified patent and that said Letters Patent is hereby corrected as shown below:

On the Title Page

In Column 1, (54) Title, Lines 1-2, delete "GATE DRIVER AND DISPLAY DEVICE HAVING THE SAME" and insert -- DISPLAY DEVICE HAVING A GATE DRIVER IN A NON-DISPLAY AREA HAVING A CURVED PORTION --.

In Column 1, (30) Foreign Application Priority Data, Line 1, delete "(KP)" and insert -- (KR) --.

In the Specification

In Column 1, Lines 1-2, delete "GATE DRIVER AND DISPLAY DEVICE HAVING THE SAME" and insert -- DISPLAY DEVICE HAVING A GATE DRIVER IN A NON-DISPLAY AREA HAVING A CURVED PORTION --.

In the Claims

In Column 14, Line 6, in Claim 1, delete "fines;" and insert -- lines; --.

In Column 14, Line 33, in Claim 4, delete "dock" and insert -- clock --.

Signed and Sealed this
Third Day of September, 2024

Katherine Kelly Vidal
*Director of the United States Patent and Trademark Office*